United States Patent [19]

Bronstert et al.

[11] 4,144,073

[45] Mar. 13, 1979

[54] PHOTOPOLYMERIZABLE COMPOSITION FOR THE MANUFACTURE OF RELIEF PRINTING PLATES

[75] Inventors: Bernd Bronstert, Frankenthal; Werner Lenz, Bad Duerkheim; Heinrich Hartmann, Limburgerhof; Heinz-Ulrich Werther, Wachenheim; Manfred Zuerger, Mannheim, all of Fed. Rep. of Germany

[73] Assignee: BASF Aktiengesellschaft, Ludwigshafen, Fed. Rep. of Germany

[21] Appl. No.: 840,029

[22] Filed: Oct. 6, 1977

[51] Int. Cl.$^2$ ............................ G03C 1/68; G03C 5/00
[52] U.S. Cl. .................................. 96/115 P; 96/35.1; 427/54
[58] Field of Search ............................ 96/115 P, 35.1; 204/159.19; 427/54

[56] References Cited

U.S. PATENT DOCUMENTS

| | | | |
|---|---|---|---|
| 2,948,611 | 8/1960 | Barney | 96/35.1 X |
| 2,972,540 | 2/1961 | Saner et al. | 96/115 P |
| 3,081,168 | 3/1963 | Leekey et al. | 96/115 P |
| 3,625,696 | 12/1971 | Kranch et al. | 96/115 P |

Primary Examiner—Edward C. Kimlin
Assistant Examiner—Alfonso T. Suro Pico
Attorney, Agent, or Firm—Keil & Witherspoon

[57] ABSTRACT

Photopolymerizable compositions for the manufacture of relief printing plates, especially relief plates for making mats, comprising an alcohol-soluble linear polyamide, a photoinitiator and a mixture of (a) a diether or triether obtained from 1 mole of an aliphatic diol or triol and from 2 to 3 moles of N-hydroxymethylacrylamide or N-hydroxymethylmethacrylamide and (b) an unsaturated ester-urethane obtained from 1 mole of toluylene diisocyanate and 2 moles of a hydroxyalkyl acrylate or methacrylate, (a) and (b) being mixed in specific ratios.

4 Claims, No Drawings

PHOTOPOLYMERIZABLE COMPOSITION FOR THE MANUFACTURE OF RELIEF PRINTING PLATES

The present invention relates to a photopolymerizable composition for the manufacture of relief printing plates and especially of relief plates for making mats, which photopolymerizable composition consists essentially of at least one alcohol-soluble linear polyamide (nylon), photopolymerizable olefinically unsaturated monomers and at least one photoinitiator.

Letterpress printing plates which are manufactured from soluble high molecular weight linear polyamides, photopolymerizable monomers and photoinitiators have been disclosed and are distinguished by high abrasion resistance, which enables a large number of impressions to be attained with these plates. However, a known difficulty is that of selecting suitable monomers which can be combined with the polyamides to give compatible coatings which are stable on storage. Monomers of relatively low polarity tend to migrate out, whilst if substantial amounts of polar monomers are used, they tend to crystallize out and result in haze. There have been many attempts to provide suitable mixtures for this purpose (cf., for example, German Laid-Open Applications DOS 1,522,463, 1,522,469, 1,522,270, 2,064,742 and 2,238,567). However, such mixtures are not very suitable for making mats because they are insufficiently hard.

It is an object of the present invention to provide suitable photopolymer relief printing plates, based on polyamide, for making mats, which plates can be manufactured with short exposure times and have high hardness, good printing properties and a long press life.

We have found that this object is achieved with photopolymerizable compositions, consisting of essentially at least one alcohol-soluble linear polyamide, photopolymerizable olefinically unsaturated monomers M and at least one photoinitiator, which are particularly suitable for the manufacture of letterpress printing plates and especially for making mats, which compositions contain, based on the mixture of polyamide, monomers M and photoinitiator, the following monomers M:

(a) from 15 to 40% by weight of a diether or triether ($M^1$) of the formula

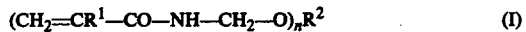

$$(CH_2=CR^1-CO-NH-CH_2-O)_n R^2 \quad (I)$$

where n is 2 or 3, $R^1$ is H or $CH_3$ (and the various $R^1$ are identical or different), and $R^2$ is an n-valent aliphatic radical of 2 to 6 carbon atoms, and (b) from 6 to 18% by weight of a monomer ($M^2$) of the formula

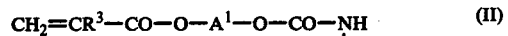

$$\begin{array}{l} CH_2=CR^3-CO-O-A^1-O-CO-NH \\ \qquad\qquad\qquad\qquad\qquad\qquad\quad | \\ \qquad\qquad\qquad\qquad\qquad\qquad\quad Z \\ \qquad\qquad\qquad\qquad\qquad\qquad\quad | \\ CH_2=CR^4-CO-O-A^2-O-CO-NH \end{array} \quad (II)$$

where $R^3$ and $R^4$ are H or $CH_3$ (and are identical or different), $A^1$ and $A^2$ are alkylene of 2 or 3 carbon atoms (and are identical or different) and Z is 2,4-toluylene or 2,6-toluylene, and in which the weight ratio of the monomer $M^1$ to the monomer $M^2$ is at least 1.5:1 and preferably from 2 to 4:1.

Preferred alcohol-soluble linear polyamides with recurring amide groups in the main chain of the molecular are polyamide copolymers which are soluble in alcoholic solvents or solvent mixtures, e.g. in lower aliphatic alcohols, alcohol-water mixtures or mixtures of alcohols with other solvents, e.g. benzenealcohol-water mixtures. They can be manufactured, for example, in the conventional manner by polycondensation or polymerization, e.g. activated anionic polymerization, of two or more lactams of 5 to 13 ring members, e.g. pyrrolidone, caprolactams, enantholactam and capryllactam. Further very suitable polyamide copolymers are polycondensation products of salts of the diamine/dicarboxylic acid type manufactured from at least three polyamide-forming starting materials. Preferred dicarboxylic acids are aliphatic dicarboxylic acids of 4 to 20 carbon atoms, e.g. adipic acid, suberic acid, sebacic acid, dodecanedicarboxylic acid and their substitution products, e.g. α,α-diethyladipic acid, α-ethylsuberic acid, heptadecane-1,8-dicarboxylic acid and heptadecane-1,9-dicarboxylic acid, and their mixtures and dicarboxylic acids containing aliphatic or aromatic ring systems. Particularly suitable diamines are aliphatic or cycloaliphatic diamines with 2 primary and/or secondary amino groups, especially diamines of 4 to 20 carbon atoms, e.g. pentamethylenediamine, hexamethylenediamine, heptamethylenediamine, octamethylenediamine and C- and/or N-substituted derivatives of these amines, e.g. N-methyl-N-ethyl-hexamethylenediamine, 1,6-diamino-4-methylhexane, 4,4'-diaminodicyclohexylmethane and 4,4'-diaminodicyclohexylpropane, and also aromatic diamines, e.g. m-phenylenediamine, m-xylylenediamine and 4,4'-diaminodiphenylmethane. In all the starting materials, the bridge members between the two carboxylic acid groups or amino groups may also be interrupted by hetero-atoms, e.g. oxygen, nitrogen or sulfur. Particularly suitable nylon copolymers are those manufactured by co-condensation of a mixture of one or more lactams, especially caprolactam, and at least one diamine salt of an aliphatic dicarboxylic acid, e.g. a mixture of ε-caprolactam, hexamethylenediammonium adipate and 4,4'-diaminodicyclohexylmethane adipate.

Suitable monomers $M^1$ of the above formula (I) are diethers and triethers obtained from an aliphatic alcohol of 2 to 6 carbon atoms and N-hydroxymethyl-acrylamide or N-hydroxymethyl-methacrylamide, e.g. the diether of 1 mole of ethylene glycol or propanediol and 2 moles of N-methylolacrylamide or N-methylolmethacrylamide, or the triether of 1 mole of glycerol or 1,1,1-trimethylolpropane and 3 moles of N-methylolacrylamide or N-methylolmethacrylamide. These compounds may be manufactured in the conventional manner from acrylamide or methacrylamide, formaldehyde and a polyhydric aliphatic alcohol. The diethers of diols of 2 or 3 carbon atoms, and especially the diethers of ethylene glycol, are preferred.

Suitable monomers $M^2$ of the above formula (II) can be manufactured in a simple manner by reacting 2,4- or 2,6-toluylene diisocyanate or the technical mixture of isomers of these diisocyanates with 2-hydroxyethyl, 2-hydroxypropyl or 3-hydroxypropyl acrylate or methacrylate or with a mixture of these glycol monoacrylates or monomethacrylates. In the Examples and Comparative Experiments which follow, the toluylene radical referred to in connection with monomers $M^2$ is a mixture of 80% by weight of the 2,4-isomer and 20% by weight of the 2,6-isomer, resulting from the use of a commercial toluylene diisocyanate mixture. The propylene radical referred to is the 1,2-propylene radical, the acrylyl group being bonded to the extent of 65% by weight in the 1-position and to the extent of 35% by weight in the 2-position.

The photopolymerizable compositions according to the invention contain from 15 to 40, and especially from 25 to 35, % by weight of monomer $M^1$, and from 6 to 18, and especially from 9 to 15, % by weight of monomer $M^2$, the percentages being based on the mixture of nylon, monomers and photoinitiator, and the weight ratio of the monomer $M^1$ to the monomer $M^2$ is at least 1.5:1 and generally from about 1.5:1 to 7:1, preferably from 2:1 to 4:1.

The polyamide is generally present in an amount of from about 37 to 78% by weight, and especially from 50 to 65% by weight, based on the sum of polyamide, monomers and photoinitiator. The photoinitiator content is advantageously from 0.01 to 5% by weight and especially from 0.5 to 2% by weight and depends on the nature of the photoinitiator and on its activity.

Virtually all compounds which form radicals on exposure to light or irradiation and start the polymerization of the monomers can be used as photoinitiators for the photopolymerizable compositions according to the invention. Examples of such initiators are given in Chemical Reviews, 68, No. 2, pages 125–151 (March 25, 1968). Some specific examples are acyloins and their derivatives, e.g. benzoin, benzoin alkyl ethers, α-methylol-benzoin and its ethers, α-methylbenzoin, diketones and their derivatives, e.g. diacetyl, benzil, benzil monoketals, e.g. benzil dimethylketal or benzil ethylene glycol monoketal, unsubstituted and substituted quinones, e.g. anthraquinone, and the like. Individual photoinitiators, or mixtures of photoinitiators, may be used.

Inhibitors, dyes, pigments and other conventional additives may be introduced into the photopolymerizable compositions in the conventional manner.

Suitable polymerization inhibitors are those conventionally used to prevent thermal polymerization, for example hydroquinone, p-methoxyphenol, p-quinone, copper(I) chloride, methylene blue, β-naphthol, phenols and salts of N-nitrosocyclohexylhydroxylamine. The polymerization inhibitors are usually used in amounts of from 0.01 to 2.0% by weight, preferably from 0.05 to 0.5% by weight, based on the total mixture.

Examples of suitable dyes are indigo dyes and especially the soluble metal complex dyes described in German Laid-Open Application DOS 1,905,012, which are advantageously used in amounts of from 0.005 to 5% by weight, based on the total mixture.

The photopolymerizable compositions according to the invention are particularly suitable for the manufacture of relief printing plates and very especially of relief plates intended for making mats. The printing plates can be prepared by conventional methods, e.g. by applying a solution of the composition to a suitable support and then drying the coated support, or by pressing, extruding or calendering the composition according to the invention. Films can also be manufactured from the compositions in the conventional manner and can then also be laminated, for example, to a support.

The compositions or photopolymer printing plates can be processed in the conventional manner by subjecting them to image-wise exposure with actinic light of wavelengths from 1,800 to 7,000 A, especially from 3,000 to 4,500 A, and then mechanically removing and/or washing out the unexposed areas by means of a developer solution in which the unexposed composition is soluble, e.g. an alcoholic solvent.

Examples of sources of actinic light are high-energy lamps, e.g. carbon arc lamps, mercury vapor lamps, fluorescent UV lamps, tungsten lamps and xenon lamps.

It was surprising that the compositions according to the invention, having a specific composition, exhibit compatibility of the components and can be processed, with short exposure times, to give relief printing plates which combine good printing properties and a long press life with great hardness, which is very desirable for making mats. In view of the above prior art it was to be expected that, in order to obtain polyamide printing plates of great hardness with short exposure times, the monomer content in the photopolymerizable polyamide-monomer mixtures would have to be increased. However, if, for example, the content of the bis-(N-hydroxymethyl-acrylamido)-ether of ethylene glycol (monomer $M^1$) in the mixture is increased from 30 to 42% by weight, the ball indentation hardness of the resulting exposed printing plates increases, it is true, from 700 to 800 g/mm$^2$ at a satisfactory exposure time, but the compatibility of the components of the mixture is unsatisfactory in both cases. If a compound which improves compatibility, e.g. p-toluenesulfonic acid N-n-butylamide, is added to the mixtures, the hardness of the resulting exposed printing plates is reduced. Increasing the content of monomer $M^2$ in a mixture of polyamide and monomer $M^2$ from 30 to 42% by weight gives compositions with unsatisfactory exposure times and results in only a limited increase in hardness of the resulting exposed printing plates. In view of this, it was not to be expected that the addition of monmer $M^2$ to a mixture of polyamide and monomer $M^1$ would serve to improve the compatibility of the components of compositions which can be processed, with short exposure time, into relief printing plates of unexpected hardness.

The parts and percentages mentioned in the Examples and Comparative Experiments which follow are by weight, unless stated otherwise.

EXAMPLES AND COMPARATIVE EXPERIMENTS x parts of an alcohol-soluble polyamide copolymer (PA) manufactured by polycondensing 35 parts of hexamethylenediammonium adipate, 35 parts of p,p'-diammonium cyclohexylmethane and 30 parts of ε-caprolactam, y parts of the monomers shown in Table 1 and, where relevant, z parts of one of the agents for improving compatibility, shown in the Table, in each case together with 1 part of benzoin ethyl ether as photoinitiator, 0.02 part of a commercial 2,4,6-trialkylphenol as thermal polymerization inhibitor and 0.01 part of a chromium complex dye (C.I. No. 12,195), are dissolved in a 9:1 methanol-water mixture. The solutions are cast on a steel sheet coated with an adhesive and the layers are dried, the thickness of the dried layers being 670 μm in each case.

Using a suitable negative, the resulting plates are exposed, in a flat-plate exposure unit, to ultraviolet light of an intensity of 3,300μ W/cm$^2$. The unexposed areas of the plate are then removed by washing out for 7 minutes with an ethanol-water mixture, and the plate is treated in a commercial dryer/afterexposure unit for 6 minutes at 130° C.

The ball indentation hardness (g/mm$^2$) of the resulting relief plates is determined after at least 10 days' storage in the air at 60% relative humidity; the exposure time required to reproduce a 3% highlight dot (54 lines/cm screen) is also determined. Finally, the compatibility of the components of the unexposed photosensitive mixtures is assessed after storing the plates for 4 weeks at 80% relative humidity. The results are shown in the Table, in which the symbols have the following meanings:

PA = the above polyamide copolymer
$M^1$ = a monomer of the formula

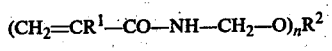

where the radicals $R^1$ and $R^2$ have the following meanings:

in $M^1$-1: $R^1$ = H, $R^2$ = -CH$_2$-CH$_2$-, n = 2
in $M^1$-2: $R^1$ = H,

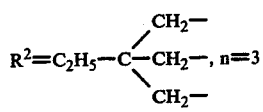

$M^2$ = a monomer of the formula

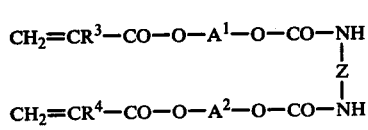

where the radicals R, A and Z have the following meanings:

in $M^2$-1: $R^3$ and $R^4$ = H, $A^1$ and $A^2$ = —CH$_2$—CH$_2$—, Z = toluylene
in $M^2$-2: $R^3$ and $R^4$ = CH$_3$, $A^1$ and $A^2$ = —CH$_2$—CH$_2$—, Z = toluylene
in $M^2$-3: $R^3$ and $R^4$ = H, $A^1$ and $A^2$ = propylene, Z = toluylene
in $M^2$-4: $R^3$ and $R^4$ = CH$_3$, $A^1$ and $A^2$ = propylene, Z = toluylene
in $M^2$-5 V: $R^3$ and $R^4$ = H, $A^1$ and $A^2$ = —(CH$_2$)$_4$—, Z = toluylene
in $M^2$-6 V: $R^3$ and $R^4$ = H, $A^1$ and $A^2$ = propylene, Z = —(CH$_2$)$_6$—
$M^3$ = 1,1,1-trimethylolpropane triacrylate
EG = ethylene glycol
PSB = p-toluenesulfonic acid N-n-butylamide
DIUR = (CH$_3$CH$_2$—CO—O—A$^1$—O—CO—NH)$_2$Z, where $A^1$ = propylene and Z = toluylene.

TABLE
(Continuation)
Results of Examples (B1 – B5) and Comparative Experiments (V1 – V16)

| Experiment No. | Nylon (parts) | Monomer (parts) | Agent for improving compatibility | Compatibility | Ball indentation hardness (g/mm$^2$) | Exposure time (min.) |
|---|---|---|---|---|---|---|
| B 1 | PA (57) | $M^1$-1 (30) | $M^2$-1 (12) | satisfactory | 1,200 | 6 |
| B 2 | PA (57) | $M^1$-1 (30) | $M^2$-2 (12) | satisfactory | 1,600 | 6 |
| B 3 | PA (57) | $M^1$-1 (30) | $M^2$-3 (12) | satisfactory | 1,200 | 5 |
| B 4 | PA (57) | $M^1$-1 (30) | $M^2$-4 (12) | satisfactory | 1,900 | 6 |
| B 5 | PA (57) | $M^1$-2 (30) | $M^2$-3 (12) | satisfactory | 960 | 4 |

TABLE
Results of Examples (B1 – B5) and Comparative Experiments (V1 – V16)

| Experiment No. | Nylon (parts) | Monomer (parts) | Agent for improving compatibility | Compatibility | Ball indentation hardness (g/mm$^2$) | Exposure time (min.) |
|---|---|---|---|---|---|---|
| V 1 | PA (69) | $M^1$-1 (30) | — | migrates out | 700 | 4 |
| V 2 | PA (57) | $M^1$-1 (40) | — | migrates out | 800 | 4 |
| V 3 | PA (69) | $M^1$-2 (30) | — | migrates out | 380 | 12 |
| V 4 | PA (69) | $M^2$-1 (30) | — | satisfactory | 500 | 16 |
| V 5 | PA (69) | $M^2$-2 (30) | — | satisfactory | 740 | 12 |
| V 6 | PA (69) | $M^2$-3 (30) | — | satisfactory | 650 | 16 |
| V 7 | PA (57) | $M^2$-3 (42) | — | satisfactory | 800 | 16 |
| V 8 | PA (69) | $M^2$-4 (30) | — | satisfactory | 780 | 10 |
| V 9 | PA (57) | $M^2$-5 V (42) | — | crystallizes out | — | — |
| V 10 | PA (57) | $M^1$-1 (30) | EG (12) | migrates out slightly | 600 | 4 |
| V 11 | PA (57) | $M^1$-1 (30) | PSB (12) | satisfactory | 550 | 4 |
| V 12 | PA (57) | $M^1$-1 (30) | DIUR | satisfactory | 660 | 6 |
| V 13 | PA (57) | $M^1$-1 (30) | $M^2$-5 V | cloudy | — | — |
| V 14 | PA (57) | $M^1$-1 (30) | $M^2$-6 V | satisfactory | 680 | 4 |
| V 15 | PA (57) | $M^1$-1 (18) + $M^3$ (12) | PSB (12) | migrates out | — | — |
| V 16 | PA (69) | $M^3$ (30) | $M^2$-3 (12) | migrates out | — | — |

As the Table shows, increasing the amount of only one of the monomers $M^1$ or $M^2$ leads to compatibility problems in the case of $M^1$, and to a failure, in both cases, to achieve the desired hardness of the resulting printing plate after exposure. The addition of agents for improving compatibility only gives printing plates without compatibility problems and exhibiting satisfactory hardness and satisfactory exposure times if the monomers $M^2$ according to the invention are used as such agents. (Experiments B 1 to B 5).

MATTING

Mats are produced with the relief plates obtained according to Examples B 2 and B 3, using commercial flongs and a pressure of 80 kg/cm$^2$, and are dried in the conventional manner. A curved stereotype is produced from each mat and is printed on a newspaper rotary press. The prints show a clear sharp image without the broadening of fine lines and letters which is typical of pattern plates which are too soft. There are no detectable differences between the 1st and the 10th mat.

We claim:
1. A photopolymerizable composition for the manufacture of letterpress printing plates or relief plates for making mats, which comprises a mixture of:
(a) from 37 to 78% by weight of an alcohol-soluble linear polyamide,

(b) from 0.01 to 5% by weight of at least one photoinitiator, (c) from 15 to 40% by weight of a diether or triether monomer ($M^1$) of the formula $$(CH_2=CR^1-CO-NH-CH_2-O)_n R^2 \quad (I)$$

where n is 2 or 3, $R^1$ is H or $CH_3$ (and the various $R^1$ are identical or different), and $R^2$ is an n-valent aliphatic radical of 2 to 6 carbon atoms, and (d) from 6 to 18% by weight of a monomer ($M^2$) of the formula $$\begin{array}{l} CH_2=CR^3-CO-O-A^1-O-CO-NH \\ \qquad\qquad\qquad\qquad\qquad\qquad\qquad | \\ \qquad\qquad\qquad\qquad\qquad\qquad\qquad Z \\ \qquad\qquad\qquad\qquad\qquad\qquad\qquad | \\ CH_2=CR^4-CO-O-A^2-O-CO-NH \end{array} \quad (II)$$

where $R^3$ and $R^4$ are H or $CH_3$ (and are identical or different), $A^1$ and $A^2$ are alkylene of 2 or 3 carbon atoms (and are identical or different) and Z is 2,4-toluylene or 2,6-toluylene, the weight ratio of the monomer $M^1$ to the monomer $M^2$ being at least 1.5:1, the above percentages being based on the mixture of polyamide, photoinitiator and monomers.

2. A photopolymerizable composition as set forth in claim 1, wherein the amount of monomer $M^1$ is from 25 to 35% by weight, based on the mixture.

3. A photopolymerizable composition as set forth in claim 1, wherein the amount of monomer $M^2$ is from 9 to 15% by weight, based on the mixture.

4. A photopolymerizable composition as set forth in claim 1, wherein the weight ratio of monomer $M^1$ to monomer $M^2$ is from 2:1 to 4:1.

* * * * *

UNITED STATES PATENT AND TRADEMARK OFFICE
CERTIFICATE OF CORRECTION

PATENT NO. : 4,144,073
DATED : March 13, 1979
INVENTOR(S) : Bernd Bronstert et al It is certified that error appears in the above-identified patent and that said Letters Patent are hereby corrected as shown below:

IN THE HEADING:

Please insert

[30] Foreign Application Priority Data

Oct. 6, 1976 Fed.Rep. of Germany.... 26 44 986

Under References Cited

Reference Kranch et al should read -- Krauch et al --.

Signed and Sealed this

Seventeenth Day of March 1981

[SEAL]

Attest:

RENE D. TEGTMEYER

Attesting Officer — Acting Commissioner of Patents and Trademarks